United States Patent [19]
Liu

[11] Patent Number: 5,943,209
[45] Date of Patent: Aug. 24, 1999

[54] MODULARIZED ELECTRONIC COMPONENT COOLING APPARATUS

[76] Inventor: Yen-Wen Liu, 13 Fl., No. 90, Chiu Kang St., Wen Shan Dist., Taipei, Taiwan

[21] Appl. No.: 08/944,176

[22] Filed: Oct. 6, 1997

[51] Int. Cl.$^6$ ...................................................... H05K 7/20
[52] U.S. Cl. ......................... 361/695; 361/697; 165/80.3; 165/185
[58] Field of Search ..................................... 361/695, 697, 361/704, 687, 702, 707, 717, 718, 722, 727; 257/718, 719, 722, 727; 174/16.3; 165/80.3, 185

[56] References Cited

U.S. PATENT DOCUMENTS

| | | | |
|---|---|---|---|
| 5,377,745 | 1/1995 | Hsieh | 165/80.3 |
| 5,409,352 | 4/1995 | Lin | 415/177 |
| 5,506,752 | 4/1996 | Kong | 361/695 |
| 5,523,918 | 6/1996 | Chiou | 361/695 |
| 5,661,638 | 8/1997 | Mira | 361/697 |
| 5,768,102 | 6/1998 | Ma | 361/695 |

Primary Examiner—Leo P. Picard
Assistant Examiner—Anatoly Vortman
Attorney, Agent, or Firm—Bacon & Thomas, PLLC

[57] ABSTRACT

An electronic component cooling apparatus fastened to a CPU package for dissipating heat, including a heat sink module retained in contact with the CPU package, the heat sink module having of radiating fins radially arranged at a top side and a plurality of retaining notches in corners, a fastening device fastened to the CPU package to hold down the heat sink module, the fastening device having a fixed hook and a movable hook at two opposite sides respectively hooked up with respective retainer blocks of the CPU package, and a fan unit module mounted on the heat sink module and controlled to cause currents of air for carrying heat away from the heat sink module.

3 Claims, 4 Drawing Sheets

MODULARIZED ELECTRONIC COMPONENT COOLING APPARATUS

BACKGROUND OF THE INVENTION

The present invention relates to an electronic component cooling apparatus adapted for fastening to, for example, a CPU package for dissipating heat, and more specifically to such an electronic component cooling apparatus in which the parts are modularized for quick replacement.

In recent years, the functions and efficiency of CPUs (central processing unit) for PC (personal computer) have been greatly improved. Nowadays, 64-bit CPUs have been intensively used to replace early 16-bit CPUs. Current advanced CPUs including Pentium MMX (Intel), K6 (AMD), M2 (Cyrix), etc., are commonly packed in a package for quick installation by plugging. Because different CPUs have different sizes, fans of different sizes may be used to fit CPUs of different sizes. U.S. Pat. No. 5,629,834 discloses an electronic component cooling apparatus, in which radiation fins are provided on a base of a heat sink in a manner to surround an impeller. The radiation fins are arranged so as to be in conformity to a direction of air flow from the impeller being rotated.

SUMMARY OF THE INVENTION

It is one object of the present invention to provide an electronic component cooling apparatus which allows the user to replace the modularized parts thereof separately. It is another object of the present invention to provide an electronic component cooling apparatus which has radiation fins arranged so as to be in conformity to a direction tangent to the periphery of a fan thereof. It is another object of the present invention to provide an electronic component cooling apparatus which permits the parts thereof to be quickly and detachably fastened to one another by a hooked joint.

DETAILED DESCRIPTION OF THE PREFERRED EMBODIMENT

Figure 1:
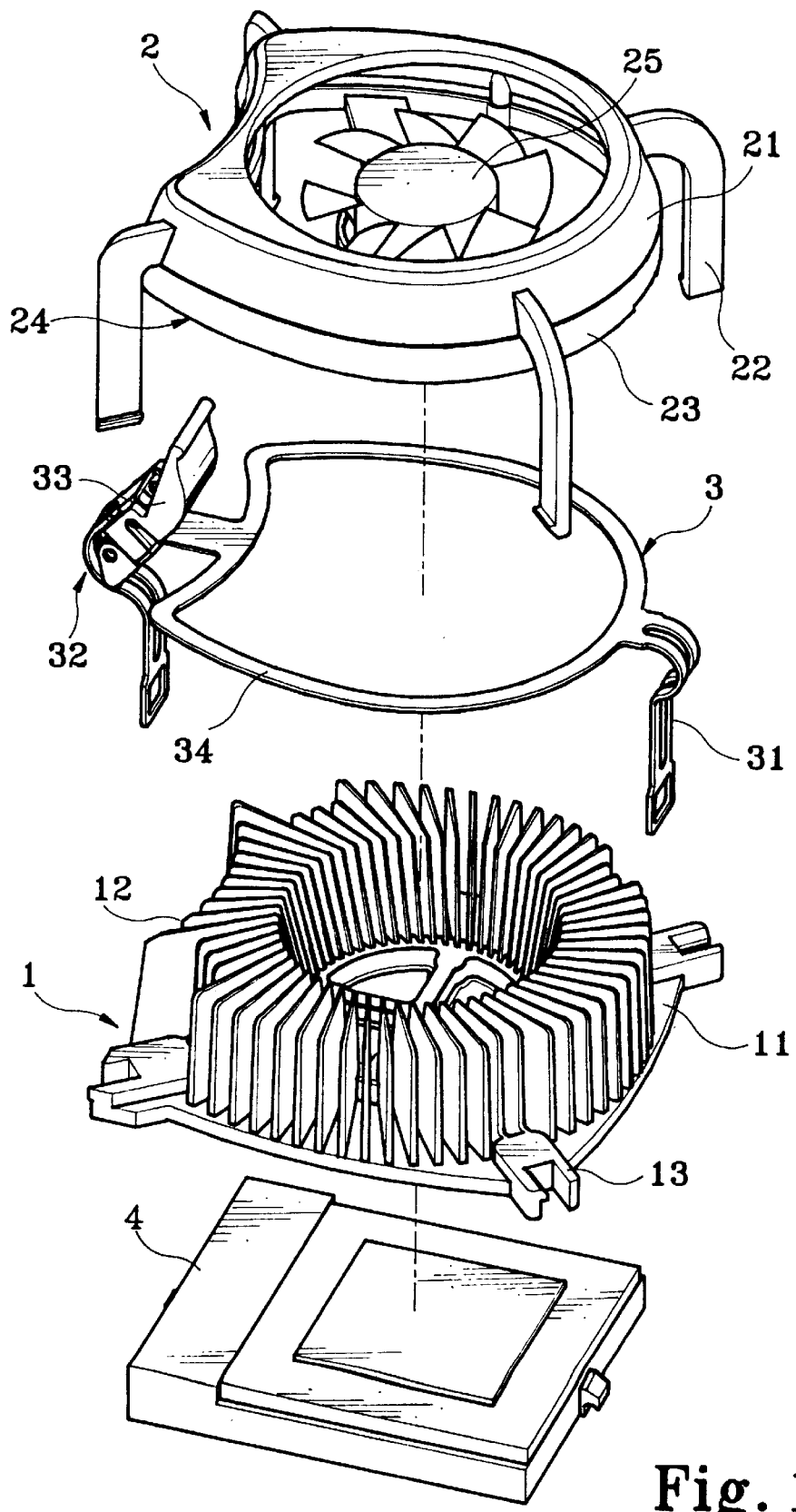
FIG. 1 is an exploded view of an electronic component cooling apparatus according to the present invention.
Figure 2A:
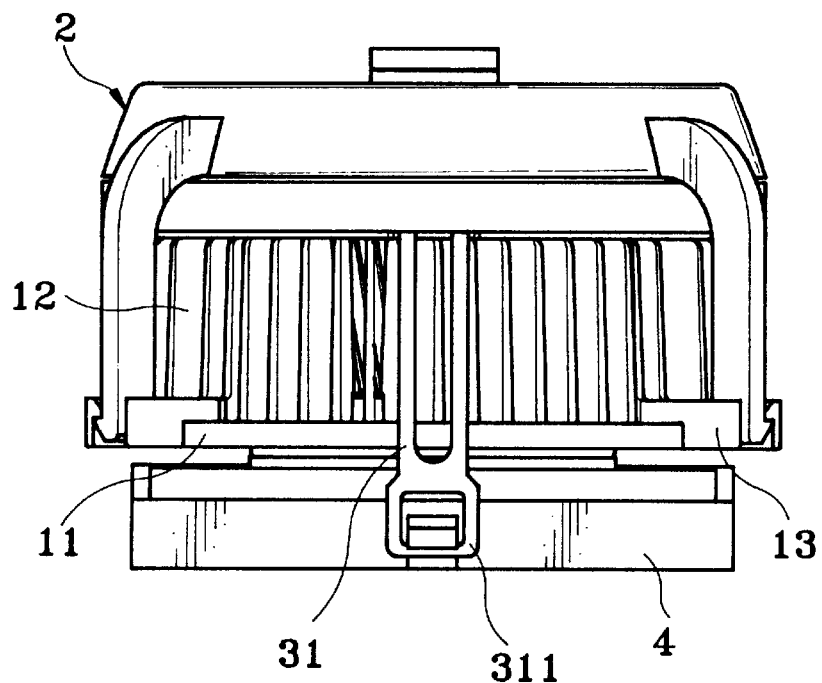
FIG. 2A is a side view of the present invention, showing the electronic component cooling apparatus installed.
Figure 2B:
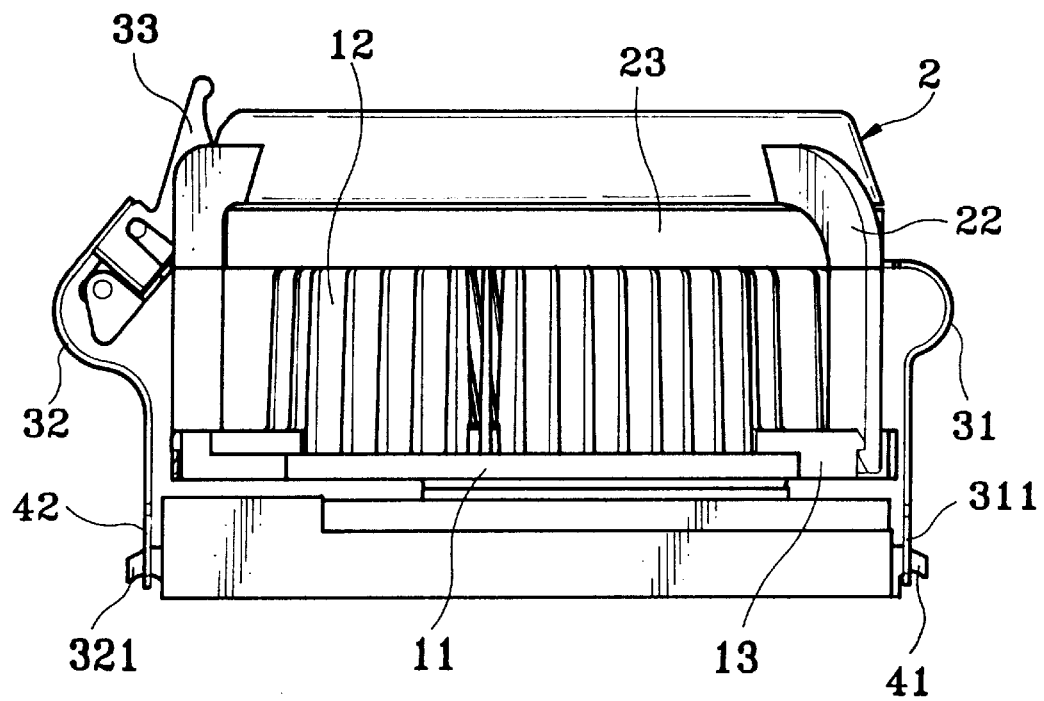
FIG. 2B is front view of the present invention, showing the electronic component cooling apparatus installed.
Figure 3:
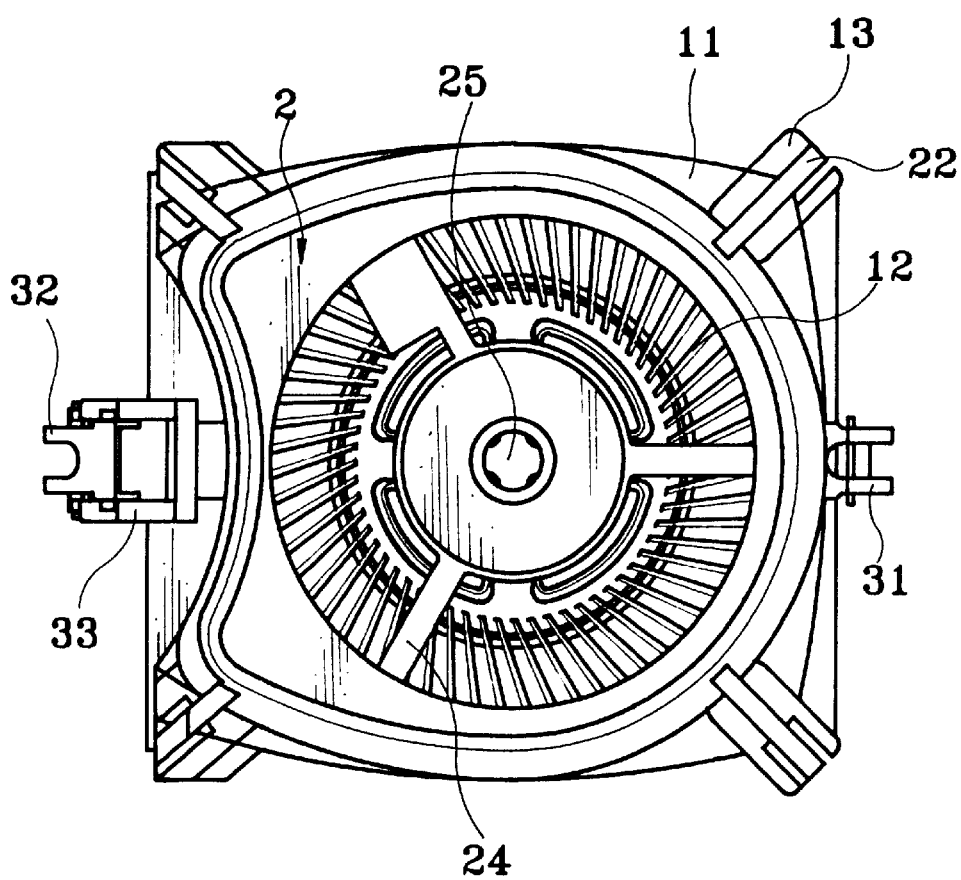
FIG. 3 is a top plain view of the electronic component cooling apparatus according to the present invention.
Figure 5:
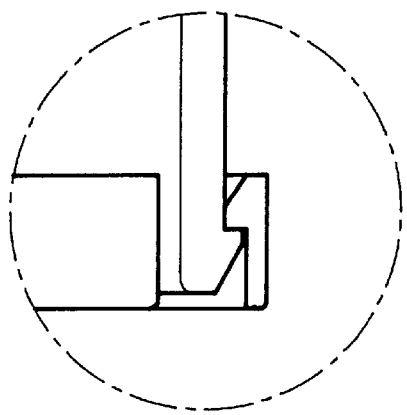
FIG. 5 is an enlarged view of a part of the present invention, showing the hooked coupling rod hooked up with the corresponding retaining notch of the heat sink module.

Referring to FIG. 1, an electronic component cooling apparatus in accordance with the present invention is generally comprised of a heat sink module 1, a fan unit module 2, and a fastening device 3. The heat sink module 1 comprises a base plate 11, a plurality of radiating fins 12 integral with the base plate 11 and radially arranged at its top side, and a plurality of retaining notches 13 respectively disposed in corners thereof.

Figure 4:
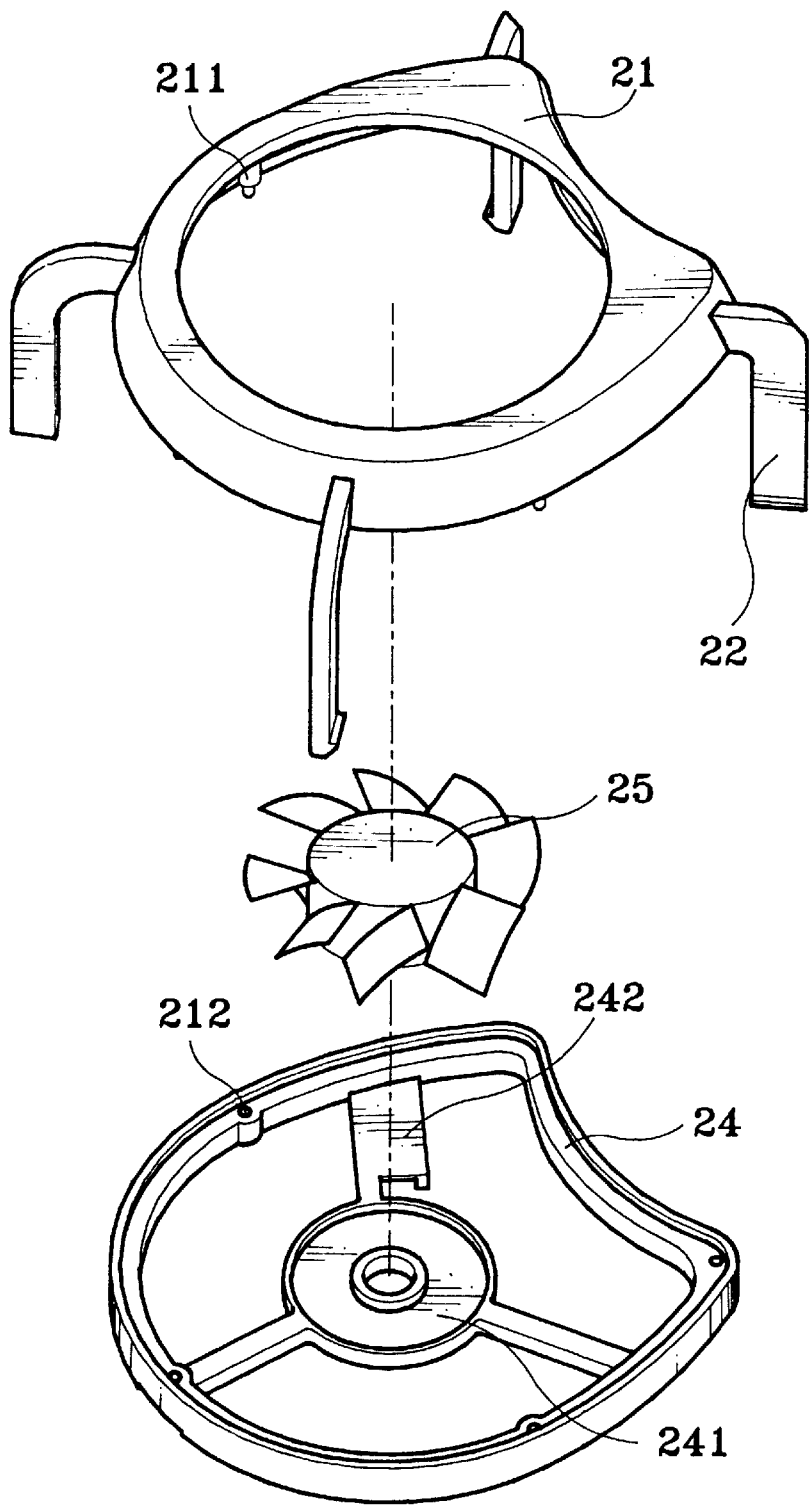
FIG. 4 is an exploded view of a fan unit module according to the present invention.

Referring to FIG. 4 and FIG. 1 again, the fan unit module 2 comprises a fan mount 24, a fan 25 mounted on the fan mount 24, a hollow cover shell 21 covered on the fan mount 24, and a plurality of hooked coupling rods 22 integral with the periphery of the cover shell 21. The fan mount 24 comprises a fan shaft holder 241 at the center and adapted for holding the fan 25, a plurality of pin holes 212 spaced along the border, and a passage way 242 for holding electrical wires that are connected to the fan 25. The hollow cover shell 21 is covered on the fan mount 24, and having a plurality of downward locating pins 211 respectively plugged into the pin holes 212 of the fan mount 24, and a skirt 23 at the bottom around the border.

Referring to FIG. 1 again, the fastening device 3 comprises a loop-like holding down frame 34, a fixed hook plate 31 integral with and downwardly extended from the loop-like holding down frame 34 at one side, a lever 33 pivoted to the loop-like holding down frame 34 at one side opposite to the fixed hook plate 31, and a movable hook plate 32 pivoted to the lever 33. The fixed hook plate 31 has a retaining hole 311 at its bottom end. The movable hook plate 32 has a retaining hole 321 at its bottom end.

Referring to FIGS. 2A, 2B, 3 and 4, and FIG. 1 again, the heat sink module 1 is attached to the CPU package 4 with its base plate 11 disposed in close contact with the top side of the CPU package 4, then the fastening device 3 is fastened to the CPU package 4 to hold down the heat sink module 1 by: mounting the loop-like holding down frame 34 on the radiating fins 12 and hanging the retaining hole 311 of the fixed hook plate 31 and the retaining hole 321 of the movable hook plate 32 on first retainer block 41 and second retainer block 42 at two opposite sides of the CPU package 4 and then turning down the lever 33 to hold down the movable hook plate 32 in the hooked position, and then the fan unit module 2 is supported on the loop-like holding down frame 34 above the radiating fins 12 and fastened to the heat sink module 1 by forcing the hooked coupling rods 22 of the fan unit module 2 into engagement with the retaining notches 13 of the heat sink module 1.

The base plate 11 of the heat sink module 1 is a flat plate made from heat conductive material for dissipating heat from the CPU 4 into the air through the radiating fins 12. The radiating fins 12 increase the heat dissipating area of the heat sink module 1. A heat conductive glue may be applied to the bottom side of the base plate 11 of the heat sink module 1 and the top side of the CPU package 4 to improve heat dissipation efficiency.

Referring to FIG. 3 again, the radiating fins 12 are perpendicularly raised from the base plate 11 and radially arranged around the fan 25, therefore currents of air are allowed to pass through gaps in the radiating fins 12 to efficiently carry heat away from the heat sink module 2.

While only one embodiment of the present invention has been shown and described, it will be understood that various modifications and changes could be made thereunto without departing from the spirit and scope of the invention disclosed.

What the invention claimed is:

1. An electronic component cooling apparatus fastened to an electronic component for dissipating heat, comprising:

a heat sink module having a base plate retained in contact with said electronic component, a plurality of radiating fins raised from said base plate, and a plurality of retaining notches in corners of said base plate;

a fastening device fastened to said electronic component to hold down said heat sink module in contact with said electronic component;

a fan unit module mounted on said heat sink module and controlled to cause currents of air for carrying heat away from said heat sink module, said fan unit module comprising a fan mount, a fan mounted on said fan mount, and a hollow cover shell covered on said fan mount around said fan, said hollow cover shell comprising a plurality of hooked coupling rods respectively forced into engagement with the retaining notches of said heat sink module; and wherein said fastening device comprises a loop-like holding down frame mounted on said radiating fins of said heat sink module, a fixed hook plate extended from said loop-like holding down frame at one side and hooked on a retainer block at a first side of said electronic component, a lever pivoted to said loop-like holding down frame at one side opposite to said fixed hook plate, and a movable hook plate pivoted to said lever and controlled by it to hook on a retainer block at a second side of said electronic component.

2. An electronic component cooling apparatus fastened to an electronic component for dissipating heat, comprising:

a heat sink module having a base plate retained in contact with said electronic component, a plurality of radiating fins raised from said base plate, and a plurality of retaining notches in corners of said base plate;

a fastening device fastened to said electronic component to hold down said heat sink module in contact with said electronic component;

a fan unit module mounted on said heat sink module and controlled to cause currents of air for carrying heat away from said heat sink module, said fan unit module comprising a fan mount, a fan mounted on said fan mount, and a hollow cover shell covered on said fan mount around said fan, said hollow cover shell comprising a plurality of hooked coupling rods respectively forced into engagement with the retaining notches of said heat sink module; and wherein said cover shell has a skirt at a bottom side thereof around the border.

3. An electronic component cooling apparatus fastened to an electronic component for dissipating heat, comprising:

a heat sink module having a base plate retained in contact with said electronic component, a plurality of radiating fins raised from said base plate, and a plurality of retaining notches in corners of said base plate;

a fastening device fastened to said electronic component to hold down said heat sink module in contact with said electronic component;

a fan unit module mounted on said heat sink module and controlled to cause currents of air for carrying heat away from said heat sink module, said fan unit module comprising a fan mount, a fan mounted on said fan mount, and a hollow cover shell covered on said fan mount around said fan, said hollow cover shell comprising a plurality of hooked coupling rods respectively forced into engagement with the retaining notches of said heat sink module; and wherein said fan mount of said fan unit module comprises a plurality of pin holes, and said cover shell of said fan unit module comprises a plurality of downward locating pins respectively forced into engagement with the pin holes of said fan mount.

\* \* \* \* \*

UNITED STATES PATENT AND TRADEMARK OFFICE
Certificate

Patent No. 5,943,209                                                            Patented: August 24, 1999

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Duan-Ying Lin, New Taipei City (TW).

Signed and Sealed this Thirtieth Day of October 2012.

*JAYPRAKASH N. GANDHI*
*Supervisory Patent Examiner*
*Art Unit 2835*
*Technology Center 2800*